(12) United States Patent
Lee et al.

(10) Patent No.: US 8,530,275 B2
(45) Date of Patent: *Sep. 10, 2013

(54) SEMICONDUCTOR DEVICE, METHOD OF MANUFACTURING THE SEMICONDUCTOR DEVICE, FLIP CHIP PACKAGE HAVING THE SEMICONDUCTOR DEVICE AND METHOD OF MANUFACTURING THE FLIP CHIP PACKAGE

(75) Inventors: Se-Young Lee, Suwon-si (KR); You-Seung Jin, Seoul (KR); Geon-Woo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/563,212

(22) Filed: Jul. 31, 2012

(65) Prior Publication Data

US 2012/0295402 A1 Nov. 22, 2012

Related U.S. Application Data

(62) Division of application No. 12/228,378, filed on Aug. 12, 2008, now Pat. No. 8,252,630.

(30) Foreign Application Priority Data

Aug. 30, 2007 (KR) .......................... 10-2007-0087663

(51) Int. Cl.
*H01L 21/44* (2006.01)

(52) U.S. Cl.
USPC ........................................................ 438/108

(58) Field of Classification Search
USPC ................. 438/107, 117, 629, 637, 639, 638, 438/640; 257/778, E23.141, E21.001
See application file for complete search history.

(56) References Cited

U.S. PATENT DOCUMENTS 5,360,988 A * 11/1994 Uda et al. ...................... 257/529
6,417,089 B1 7/2002 Kim et al.
(Continued)

FOREIGN PATENT DOCUMENTS

| JP | 05-114655 | 5/1993 |
| JP | 2001-156173 | 6/2001 |

(Continued)

OTHER PUBLICATIONS

"Semiconductor Device, Method of Manufacturing the Semiconductor Device, Flip Chip Package Having the Semiconductor Device and Method of Manufacturing the Flip Chip Package" Specification, Drawings and Prosecution History, of U.S. Appl. No. 12/228,378, filed Aug. 12, 2008, by Inventor(s) Se-Young Lee, et al.
Notification of Allowance issued Mar. 26, 2013 in Korean Patent Application 10-2007-0087663.

*Primary Examiner* — Hoa B Trinh
(74) *Attorney, Agent, or Firm* — Onello & Mello, LLP

(57) ABSTRACT

A semiconductor device can include a semiconductor chip, a protective layer pattern, an under bump metallurgy (UBM) layer, and conductive bumps. The semiconductor chip can include a pad and a guard ring. The protective layer pattern can be formed on the semiconductor chip to expose the pad and the guard ring. The UBM layer can be formed on the protective layer and can directly make contact with the pad and the guard ring. The conductive bumps can be formed on a portion of the UBM layer on the pad. Thus, the UBM layer and the guard ring can directly make contact with each other, so that a uniform current can be provided to the UBM layer on the pad regardless of a thick difference of different portions of the UBM layer.

3 Claims, 8 Drawing Sheets

(56) References Cited

U.S. PATENT DOCUMENTS

2005/0181538 A1  8/2005  Tsai
2009/0057922 A1  3/2009  Lee et al.
2010/0164079 A1  7/2010  Dekker et al.

FOREIGN PATENT DOCUMENTS

JP  2006-228865  8/2006
JP  2006-294837  10/2006

* cited by examiner

SEMICONDUCTOR DEVICE, METHOD OF MANUFACTURING THE SEMICONDUCTOR DEVICE, FLIP CHIP PACKAGE HAVING THE SEMICONDUCTOR DEVICE AND METHOD OF MANUFACTURING THE FLIP CHIP PACKAGE

PRIORITY STATEMENT

This application is a divisional application of U.S. patent application Ser. No. 12/228,378, filed on Aug. 12, 2008, which claims the benefit of Korean Patent Application No. 10-2007-0087663 filed on Aug. 30, 2007 in the Korean Intellectual Property Office (KIPO), the contents of which applications are incorporated herein in their entirety by reference.

BACKGROUND

1. Field of the Invention

The present invention generally relates to a semiconductor device, a method of manufacturing the semiconductor device, a flip chip package having the semiconductor device, and a method of manufacturing the flip chip package. More particularly, the present invention relates to a semiconductor device having conductive bumps, a method of manufacturing the semiconductor device, a flip chip package having the semiconductor device, and a method of manufacturing the flip chip package.

2. Description of the Related Art

Generally, various semiconductor fabricating processes may be performed on a wafer to form a plurality of semiconductor chips. In order to mount the semiconductor chips on a printed circuit board (PCB), a packaging process may be performed on the wafer to form semiconductor packages.

One kind of the semiconductor package can be a flip chip package, as an example. The flip chip package can include a semiconductor chip and a substrate disposed to face each other. Pads of the semiconductor chip and pads of the substrate can be electrically connected to each other in one-to-one relation via conductive bumps. An underfilling layer can be formed between the semiconductor chip and the substrate to protect the conductive bumps from external impacts. Thus, a method of manufacturing the flip chip package can include a process for forming the conductive bumps on the pads of the semiconductor chip.

According to a conventional method of forming conductive bumps, a protective layer pattern is formed on a semiconductor chip to expose pads of the semiconductor chip. An under bump metallurgy (UBM) layer is formed on the protective layer pattern to electrically connect the pads and the UBM layer. An electroplating process can be performed on the UBM layer to form the conductive bumps on the UBM layer.

Here, the semiconductor chip can have a guard ring. The guard ring can include a metal layer for preventing a sudden flow of currents or conductive ions into the semiconductor chip.

A trench configured to receive the guard ring can be formed along an edge portion of the semiconductor chip. The guard ring can be formed together with the pads. For example, a metal layer can be formed on an upper surface of the semiconductor chip and an inner surface of the trench. The metal layer can be partially etched to form the pads on the upper surface of the semiconductor chip, and the guard ring on the inner surface of the trench. An insulating layer pattern can be formed on the semiconductor chip. The UBM layer can be formed on the insulating layer pattern.

Therefore, the UBM layer can be formed along the inner surface of the trench. Here, a portion of the guard ring on an upper end of the trench can have a thickness greater than that of other portions of the guard ring on the inner surface of the trench. Thus, a portion of the UBM layer over the upper end of the trench can have a thickness greater than that of other portions of the UBM layer on the inner surface of the trench. As a result, a portion of the UBM layer on a lower end of the trench can have a relatively thin thickness.

The thickness difference of the UBM layer can cause a size difference of the conductive bumps. Particularly, in the electroplating process for forming the conductive bumps, the current may flow through the UBM layer. However, a sufficient amount of the current may not flow through the thin portion of the UBM layer, so that the thin portion of the UBM layer can have an increased resistance. As a result, the conductive bumps on the bumps that are positioned before and behind the guard ring can have different sizes. Here, the conductive bump having a relatively smaller size can have a contact area that is less than that of the conductive bump having a relatively larger size, so that the flip chip package can have bad electrical joint reliability.

SUMMARY

In accordance with aspects of the present invention, there is provided a semiconductor device that includes conductive bumps having substantially the same size by providing a uniform current through a UBM layer regardless of a thickness difference of the UBM layer.

Also in accordance with aspects of the present invention, provided is a method of manufacturing the above-mentioned semiconductor device.

Also in accordance with aspects of the present invention, provided is a flip chip package including the above-mentioned semiconductor device.

Also in accordance with aspects of the present invention, provided is a method of manufacturing the above-mentioned flip chip package.

A semiconductor device in accordance with one aspect of the present invention includes a semiconductor chip, a protective layer pattern, an under bump metallurgy (UBM) layer and conductive bumps. The semiconductor chip includes a pad and a guard ring. The protective layer pattern is formed on the semiconductor chip and exposes the pad and the guard ring. The UBM layer is formed on the protective layer and makes direct contact with the pad and the guard ring. The conductive bumps are formed on a portion of the UBM layer on the pad.

The semiconductor chip can further include an insulating layer pattern having a trench that is formed therein. The guard ring can be partially formed on an inner surface of the trench and and an upper surface of the insulating layer pattern adjacent to the trench.

The protective layer pattern can have openings formed therein that partially expose the guard ring. The openings can be filled with the UBM layer.

Alternatively, the protective layer pattern can have an opening formed therein that entirely exposes the guard ring. The opening can be filled with the UBM layer.

In accordance, with another aspect of the invention, provided is a method of manufacturing a semiconductor device. A semiconductor chip having a pad and a guard ring prepared. A protective layer pattern is formed on the semiconductor chip to expose the pad and the guard ring. A UBM layer is formed on the protective layer. The UBM layer directly contacts the pad and the guard ring. Conductive bumps are formed on a portion of the UBM layer on the pad.

Preparing the semiconductor chip can include forming an insulating layer pattern having a trench on the semiconductor chip, forming a conductive layer on an upper surface of the insulating layer pattern and an inner surface of the trench, and patterning the conductive layer to form the pad on the upper surface of the insulating layer pattern and the guard ring on the inner surface of the trench.

Patterning the conductive layer can include forming the guard ring on the insulating layer pattern located at a periphery of the trench.

Forming the protective layer pattern can include forming a protective layer on the semiconductor chip, the pad and the guard ring, and patterning the protective layer to form the protective layer pattern having a first opening that exposes the pad and a second opening that exposes the guard ring.

Here, the second opening can partially expose the guard ring.

Alternatively, the second opening can entirely expose the guard ring.

The conductive bumps can be formed by an electroplating process.

The electroplating process can include forming a mask pattern on the UBM layer, which exposes the UBM layer on the pad, and providing a current to the UBM layer to grow the conductive bumps from portions of the UBM layer exposed by the mask pattern.

The method can further include performing a reflow process for forming the conductive bumps to have a spherical shape.

In accordance with yet another aspect of the invention, provided is a method of manufacturing a semiconductor device. The method includes: foaming an insulating layer pattern having a trench on a semiconductor chip; forming a conductive layer on an upper surface of the insulating layer pattern and an inner surface of the trench; patterning the conductive layer to form a pad on the upper surface of the insulating layer pattern and a guard ring on the inner surface of the trench; forming a protective layer on the semiconductor chip, the pad and the guard ring; patterning the protective layer to faun a protective layer pattern that has a first opening exposing the pad and a second opening exposing the guard ring; forming an under bump metallurgy (UBM) layer on the protective layer pattern, the UBM layer directly contacting the pad and the guard ring; forming a mask pattern on the UBM layer, the mask pattern partially exposing portions of the UBM layer on the pad; and providing a current to the UBM layer to grow conductive bumps from the portions of the UBM layer exposed by the mask pattern.

The second opening can partially exposes the guard ring.

Alternatively, the second opening can entirely exposes the guard ring.

In accordance with still another aspect of the present invention, a flip chip package can include a semiconductor chip, a protective layer pattern, an under bump metallurgy (UBM) layer, conductive bumps, and a substrate. The semiconductor chip includes a pad and a guard ring. The protective layer pattern is formed on the semiconductor chip to expose the pad and the guard ring. The UBM layer is formed on the protective layer and makes direct contact with the pad and the guard ring. The conductive bumps are formed on a portion of the UBM layer over the pad. The substrate is electrically connected to the semiconductor chip via the conductive bumps.

The flip chip package can further include an underfilling layer formed between the semiconductor chip and the substrate.

The flip chip package can further include a conductive member mounted on a second face of the substrate opposite to a first face of the substrate on which the conductive bumps are mounted.

In accordance with yet sill another aspect of the present invention, provided is a method of manufacturing a flip chip package. The method includes preparing a semiconductor chip having a pad and a guard ring. A protective layer pattern is formed on the semiconductor chip to expose the pad and the guard ring. A UBM layer is formed on the protective layer. The UBM layer is in direct contact with the pad and the guard ring. Conductive bumps are formed on a portion of the UBM layer on the pad. The conductive bumps are mounted on a substrate.

The method can further include forming an underfilling layer between the semiconductor chip and the substrate.

The method can further include mounting a conductive member on a second face of the substrate. The second face of the substrate can be opposite to a first face of the substrate on which the conductive bumps are mounted.

According to the present invention, the UBM layer and the guard ring can directly make contact with each other, so that a uniform current can be provided to the UBM layer on the pad regardless of a thickness difference of portions of the UBM layer. Thus, the conductive bumps on the pads can have a substantially uniform size. As a result, the flip chip package can have improved electrical joint reliability.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF PREFERRED EMBODIMENTS

Figure 1:
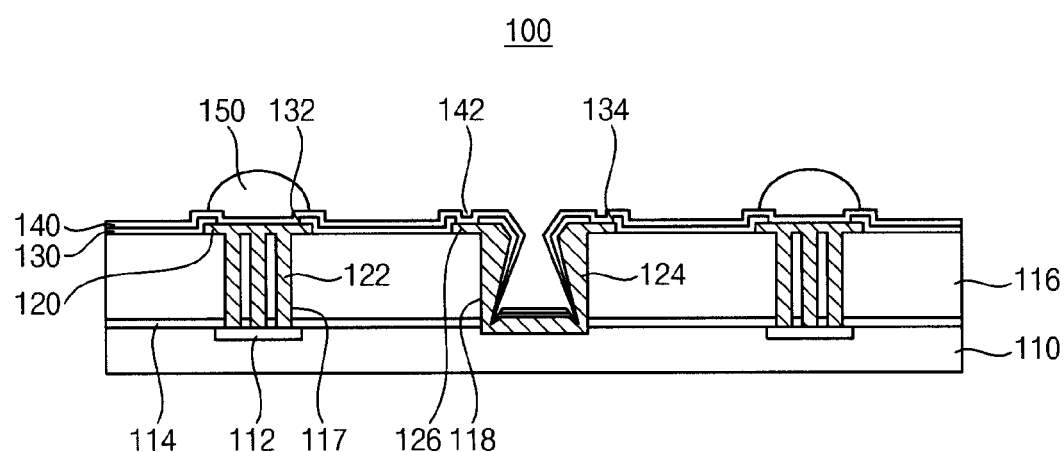
FIG. 1 is a cross-sectional view illustrating an embodiment of a semiconductor device in accordance with some aspects of the present invention.

Embodiments in accordance with the present invention are described hereinafter with reference to the accompanying drawings. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Hereinafter, some example embodiments in accordance with the present invention will be explained in detail with reference to the accompanying drawings.

Semiconductor Device

FIG. 1 is a cross-sectional view illustrating an embodiment of a semiconductor device in accordance with some aspects of the present invention.

Referring to FIG. 1, a semiconductor device 100 of this example embodiment may include a semiconductor chip 110, a protective layer pattern 130, a UBM layer 140 and conductive bumps 150.

The semiconductor chip 110 may include a semiconductor structure (not shown) formed by a plurality of semiconductor fabricating processes. The semiconductor structure may have an uppermost conductive line (not shown). The uppermost conductive line may have a contact pad 112 including a metal such as copper, aluminum, and the like. A barrier layer 114 may be formed on the semiconductor chip 110 to expose the contact pad 112. In this example embodiment, the barrier layer 114 may include an insulating material such as oxide.

The semiconductor chip may further include an insulating layer pattern 116. The insulating layer pattern 116 may be formed on the semiconductor chip 110. The insulating layer pattern 116 may have a plurality of via holes 117 exposing the contact pad 112. Further, the insulating layer pattern 116 may have a trench 118 formed along edge portions of the semiconductor chip 110. Here, a lower guard ring (not shown) may be located under the trench 118 to prevent moisture from penetrating into the semiconductor chip 110. In this example embodiment, the lower guard ring may include a metal.

A pad 120 may be formed on the insulating layer pattern 116. In this example embodiment, the pad 120 may include a metal, such as aluminum, copper, and the like. Further, the pad 120 may have plugs 122 filling the via holes 117 so that the pad 120 can be electrically connected to the contact pad 112 via the plugs 112.

A guard ring 124 may be formed on an inner surface of the trench 118. The guard ring 124 may be positioned over the lower guard ring. Further, the guard ring 124 may be partially formed on the insulating layer pattern 116 located at a periphery of an upper end of the trench 118. Here, a portion of the guard ring 124 on the insulating layer pattern 116 can correspond to a contact portion 126 directly contacting the UBM layer 140. In this example embodiment, the guard ring 124 can include a material substantially the same as that of the pad 120. Thus, the guard ring 124 may include a metal such as aluminum, copper, and the like. Here, an upper portion of the guard ring 124 on an upper end of the trench 118 may have a thickness greater than that of a lower portion of the guard ring 124 on a lower end of the trench 118. That is, the upper portion of the guard ring 124 may be protruded from the lower portion of the guard ring 124 toward an inner space of the trench 118, as shown.

The protective layer pattern 130 may be formed on the insulating layer pattern 116. The protective layer pattern 130 may have a first opening 132 exposing the pad 120, and a second opening 134 partially exposing the contact portion 126 of the guard ring 124. In this example embodiment, the guard ring 124, as well as the pad 120, may be exposed by the protective layer pattern 130.

The UBM layer 140 may be formed on the protective layer pattern 130. The UBM layer 140 may fill up the first opening 132 and the second opening 134. The UBM layer 140 may directly make contact with the pad 120 and the guard ring 124. That is, the UMB layer 140 may have a contact portion 142 in the second opening 134 to directly make contact with the contact portion 126 of the guard ring 124.

Here, the UBM layer 140 may be formed along a profile of the guard ring 124 in the trench 118. Thus, an upper portion of the UBM layer 140 may have a thickness greater than a thickness of a lower portion of the UBM layer 140 and the guard ring 124. In this case, a uniform current may not be provided to portions of the UBM layer 140 on the pads 120 at both sides of the guard ring 124 due to the thickness difference between the UBM layers 140 in the trench 118.

In contrast, according to this example embodiment, the guard ring 124 and the UBM layer 140 may be directly connected with each other via the contact portions 126 and 142 so that the current may flow through the guard ring 124 as well as the UBM layer 140 in the trench 118. That is, a resistance, which may suppress the current flow, is not increased in the trench 118 in this embodiment. As a result, the uniform current may be provided to the portions of the UBM layer 140 on the pads 120 regardless of the thickness difference of the UBM layer 140 in the trench 118.

The conductive bumps 150 may be formed on the UBM layer 140 placed on the pad 120. In this example embodiment, the conductive bumps 150 may be formed by an electroplating process with respect to the UBM layer 140. That is, a current may be provided to the UBM layer 140 to grow the conductive bumps 150 from an upper surface of the UBM layer 140. Here, as mentioned above, since the guard ring 124 and the UBM layer 140 may be directly connected with each other, the current may be uniformly supplied to the UBM layer 140. Therefore, the conductive bumps 150 formed by the electroplating process may have a uniform size. Further, in this example embodiment, the conductive bumps 150 may have a spherical shape formed by a reflow process, for example.

According to this example embodiment, the guard ring and the UBM layer may directly make contact with each other, so that the current may flow through the guard ring as well as the UBM layer. Thus, the current may be uniformly provided to the UBM layer regardless of the thickness of the UBM layer. As a result, the conductive bumps may have a uniform size.

Figure 2:
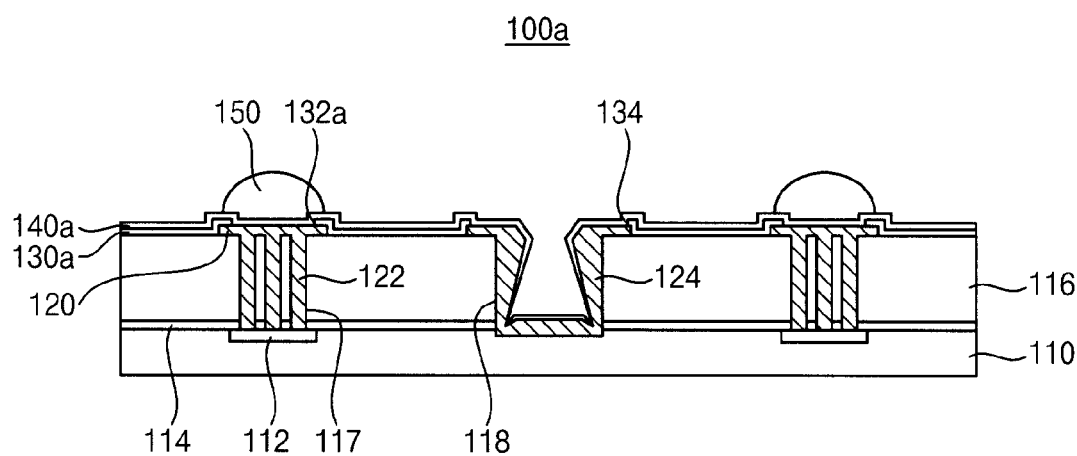
FIG. 2 is a cross-sectional view illustrating another embodiment of a semiconductor device in accordance with some aspects of the present invention.

FIG. 2 is a cross-sectional view illustrating another embodiment of a semiconductor device in accordance with aspects of the present invention.

A semiconductor device of this example embodiment may include elements substantially the same as those of the semiconductor device 100 in FIG. 1, except for a protective layer pattern and a UBM layer. Thus, the same reference numerals refer to the same elements and any further illustrations with respect to the same elements are omitted herein for brevity.

Referring to FIG. 2, the protective layer pattern 130a of the semiconductor device 100a in accordance with this example embodiment may have a first opening 132a exposing the pad 120, and a second opening 134a exposing the guard ring 124. In this example embodiment, the guard ring 124 may be entirely exposed through the second opening 134a. Thus, the UBM layer 140a may be formed on an entire surface of the guard ring 124 exposed through the second opening 134a. As a result, the entire surface of the guard ring 124 may directly make contact with the UBM layer 140.

According to this example embodiment, since the entire surface of the guard ring may directly make contact with the UBM layer, the current may be more uniformly provided to the UBM layer regardless of the thickness of the UBM layer. As a result, the conductive bumps may have a more uniform size.

Method of Manufacturing a Semiconductor Device

FIGS. 3 to 9 are cross-sectional views illustrating a method of manufacturing the semiconductor device in FIG. 1.

Figure 3:
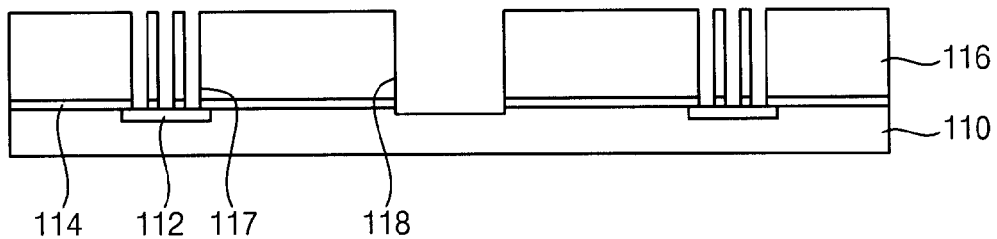
FIGS. 3 to 9 are cross-sectional views illustrating an embodiment of a method of manufacturing the semiconductor device in FIG. 1.

Referring to FIG. 3, a semiconductor chip 110 having a contact pad 112 and an insulating layer pattern 116 are formed. In this example embodiment, the semiconductor chip 110 may include a semiconductor structure (not shown) formed by a plurality of semiconductor fabrication processes, as would be appreciated by those skilled in the art. The semiconductor structure may include an uppermost conductive line (not shown), as would also be understood. The uppermost conductive line includes the contact pad 112. The contact pad 112 may include a metal, such as copper, aluminum, and the like. A barrier layer 114 is formed on the semiconductor chip 110 to expose the contact pad 112. The barrier layer 114 may include an insulating material, such as oxide. The insulating layer pattern 116 is formed on the semiconductor chip 110. The insulating layer pattern 116 is formed to have a plurality of via holes 117 exposing the contact pad 112. Further, the insulating layer pattern 116 includes a trench 118 formed along an edge portion of the semiconductor chip 110. Here, a lower guard ring (not shown), which may prevent moisture from penetrating into the semiconductor chip 110, may be provided under the trench 118.

Figure 4:
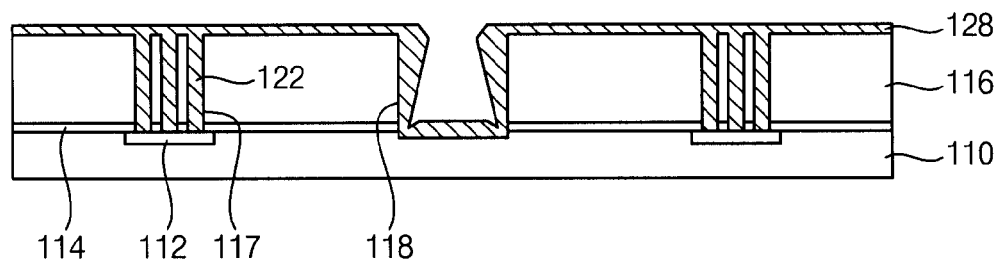

Referring to FIG. 4, a conductive layer 128 is formed on an upper surface of the insulating layer pattern 116 and an inner surface of the trench 118. In this example embodiment, the conductive layer 128 may include aluminum, copper, and the like. The conductive layer 128 fills up the via holes 117 so they are electrically connected to the contact pad 112. Here, an upper portion of the conductive layer 128 on an upper end of the trench 118 has a thickness greater than a thickness of a lower portion of the conductive layer on a lower end of the trench 118.

Figure 5:
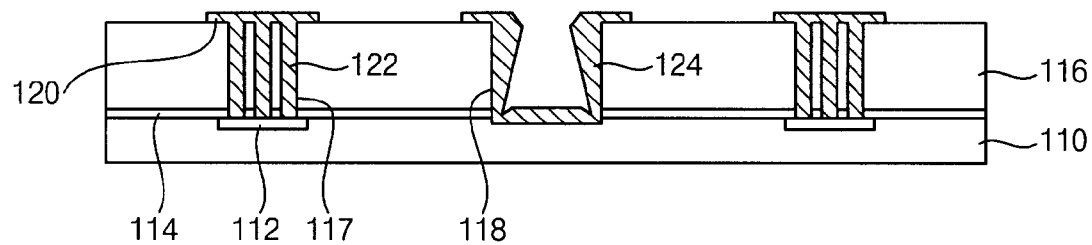

Referring to FIG. 5, the conductive layer 128 may be patterned by an etching process to form a pad 120 and a guard ring 124. The pad 120 is formed on the insulating layer pattern 116 over the contact pad 112 to be electrically connected to the contact pad 112 via a plug 122. The guard ring 124 is formed on the inner surface of the trench 118, and the upper surface of the insulating layer pattern 116 adjacent to the upper end of the trench 118, in this embodiment.

Figure 6:
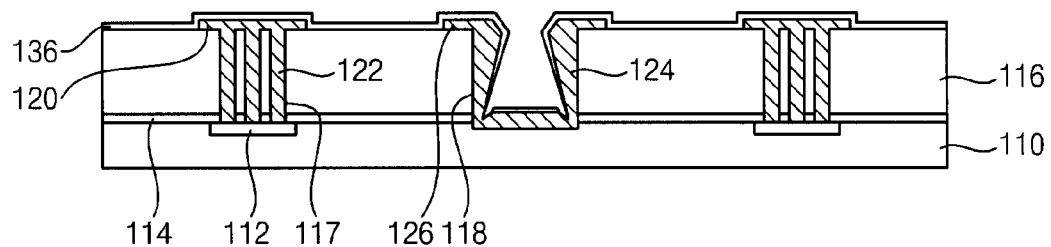

Referring to FIG. 6, a protective layer 136 may be formed on surfaces of the insulating layer pattern 116, the pad 120, and the guard ring 124.

Figure 7:
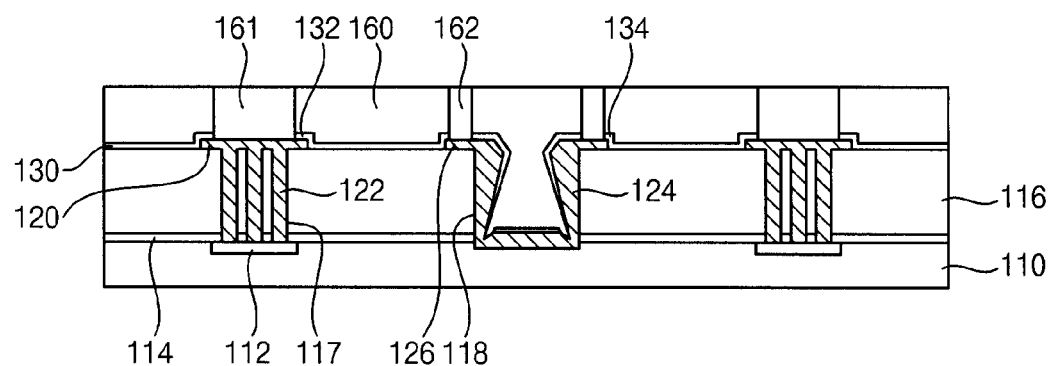

Referring to FIG. 7, a first mask pattern 160 is formed on the protective layer 136. The first mask pattern 160 can have a first opening 161 exposing the protective layer 136 on the pad 120, and a second opening 162 exposing the protective layer 136 on the insulating layer pattern 116 adjacent to the upper end of the trench 118. In this example embodiment, the first mask pattern 160 can include a photoresist pattern. The protective layer 136 can be etched using the first mask pattern 160 as an etching mask to form a protective layer pattern 130. Thus, the protective layer pattern 130 is formed to have a first opening 132 exposing the pad 120, and a second opening 134 exposing a contact portion 126 of the guard ring 124.

Figure 8:
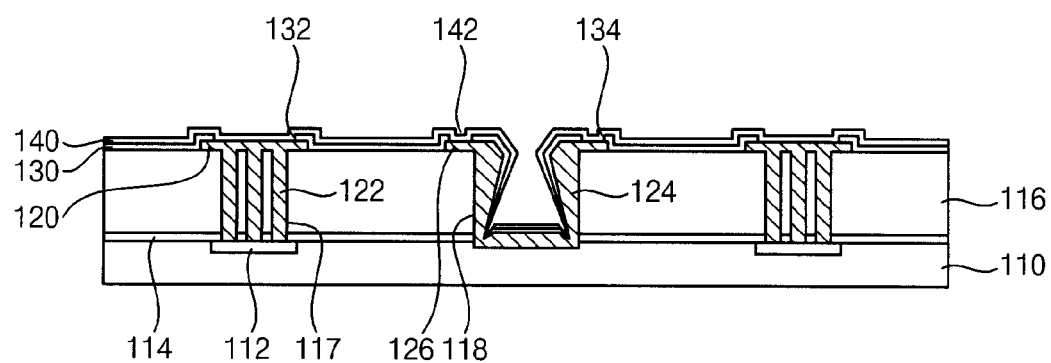

Referring to FIG. 8, the first mask pattern 160 can be removed by an ashing process and/or a stripping process, as examples. A UBM layer 140 is formed on the protective layer pattern 130 to fill up the first opening 132 and the second opening 134 with the UBM layer 140. Therefore, the pad 120 is electrically coupled to the UBM layer 140 in the first opening 132. Further, the contact portion 126 of the guard ring 124 directly contacts the UBM layer 140 via a contact portion 142 of the UBM layer 140 in the second opening 134.

Here, an upper portion of the UBM layer 140 has a thickness greater than a thickness of a lower portion of the UBM layer 140 and the guard ring 124. Since the guard ring 124 and the UBM layer 140 can be directly connected with each other via the contact portions 126 and the 142, a current can flow through the guard ring 124 as well as the UBM layer 140 in the trench 118. As a result, the current can be uniformly provided to the UBM layer 140 on the both pads 120 regardless of a thickness difference of the UBM layer 140.

Figure 9:
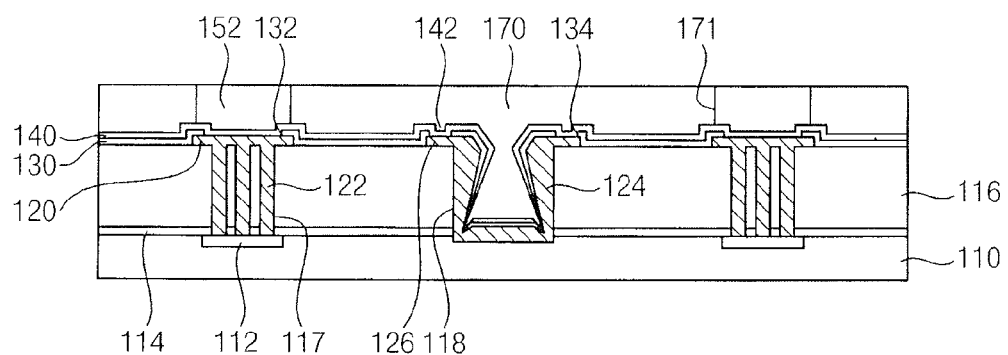

Referring to FIG. 9, a second mask pattern 170 is formed on the UBM layer 140. The second mask pattern 170 may have openings 171 exposing the UBM layer 140 on the pads 120. In this example embodiment, the second mask pattern 170 may include a photoresist pattern, as an example.

An electroplating process may be performed on an upper surface of the UBM layer 140 using the second mask pattern 170 as a plating mask to form conductive bumps 152 on the UBM layer 140. In this example embodiment, when a current is supplied to the UBM layer 140, the conductive bumps 152 grow from the upper surface of the UBM layer 140 by an oxidation-reduction reaction. Here, as mentioned above, since the guard ring 124 and the UBM layer 140 are directly connected with each other, the current is uniformly provided to the UBM layer 140. Thus, the conductive bumps 152 formed by the electroplating process have a substantially uniform size. The second mask pattern 170 can then be removed by an ashing process and/or a stripping process, as examples.

A reflow process may be performed on the conductive bumps 152 to form spherical conductive bumps 150, thereby completing the semiconductor device 100 in FIG. 1.

Here, in this example embodiment, the above-mentioned processes may be performed on the single semiconductor chip 110. Alternatively, the processes may be performed on a wafer in which a plurality of the semiconductor chips 110 are formed, the wafer may be cut along a scribe lane to form the semiconductor device 100 in FIG. 1.

Figure 10:
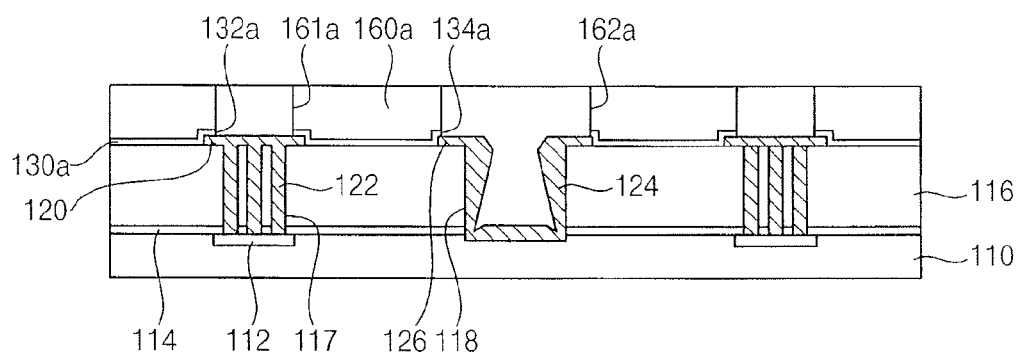
FIGS. 10 to 12 are cross-sectional views illustrating an embodiment of a method of manufacturing the semiconductor device in FIG. 2.
Figure 11:
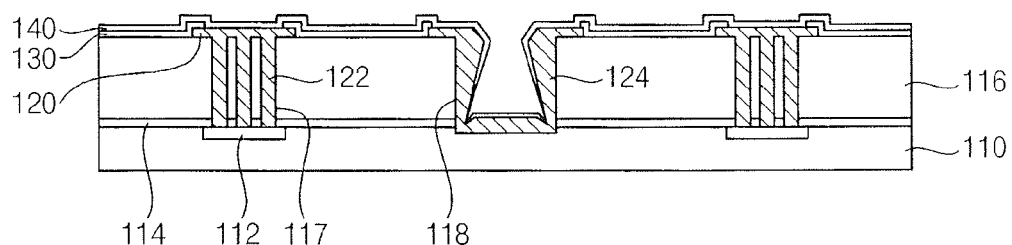
Figure 12:
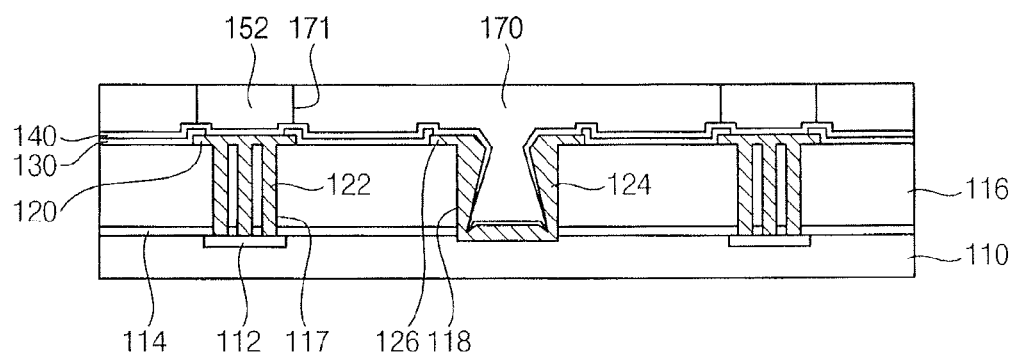

FIGS. 10 to 12 are cross-sectional views illustrating an embodiment of a method of manufacturing the semiconductor device in FIG. 2.

A method of manufacturing the semiconductor device in FIG. 2 may include processes substantially the same as those illustrated with reference to FIGS. 3 to 6. Thus, only processes after the process illustrated with reference to FIG. 6 will be explained herein.

Referring to FIG. 10, a first mask pattern 160a may be formed on the protective layer 136. The first mask pattern 160a has a first opening 161a exposing the protective layer 136 (see FIG. 6) on the pad 120, and a second opening 162a entirely exposing the protective layer 136 in the trench 118 and on the insulating layer pattern 116 adjacent to the upper end of the trench 118. The protective layer 136 may be etched using the first mask pattern 160a as an etching mask to form a protective layer pattern 130a. Thus, the protective layer pattern 130a may have a first opening 132a exposing the pad 120, and a second opening 134a entirely exposing the guard ring 124.

Referring to FIG. 11, the first mask pattern 160a may be removed by an ashing process and/or a stripping process, as examples. A UBM layer 140 may be formed on the protective layer pattern 130a to fill up the first opening 132a and the second opening 134a. Therefore, the pad 120 is electrically coupled to the UBM layer 140a in the first opening 132a. Further, the entire guard ring 124 may directly make contact with the UBM layer 140 in the second opening 134a.

Referring to FIG. 12, a second mask pattern 170 may be formed on the UBM layer 140a. The second mask pattern 170 including openings 171 exposing the UBM layer 140 on the pads 120 is added on the UBM layer 140.

An electroplating process may be performed on an upper surface of the UBM layer 140 using the second mask pattern 170 as a plating mask to form conductive bumps 152 on the UBM layer 140. The second mask pattern 170 may then be removed by an aching process and/or a stripping process, as examples.

A reflow process is performed on the conductive bumps 152 to form spherical conductive bumps 150, thereby completing the semiconductor device 100a in FIG. 2.

Flip Chip Package

Figure 13:
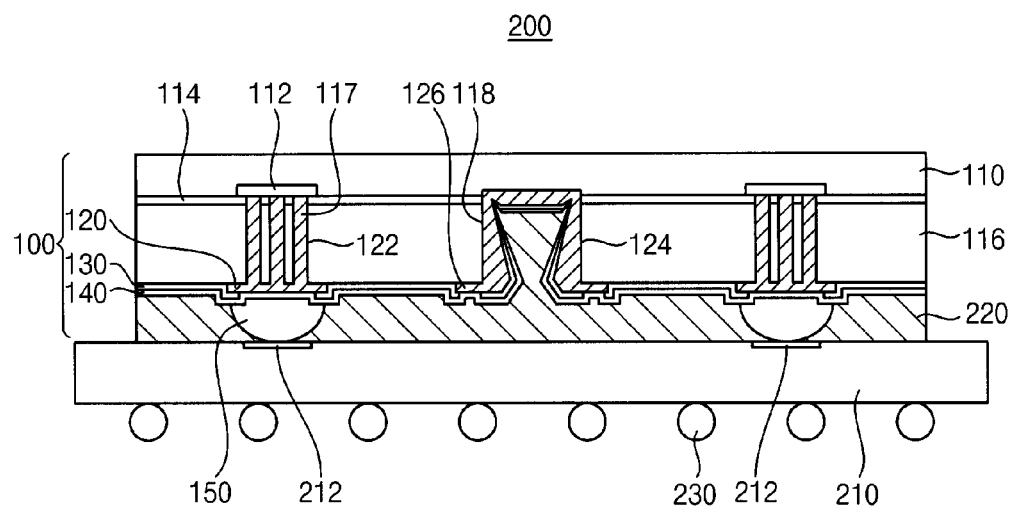
FIG. 13 is a cross-sectional view illustrating an embodiment of a flip chip package in accordance with some aspects of the present invention.

FIG. 13 is a cross-sectional view illustrating an embodiment of a flip chip package in accordance with aspects of the present invention.

Referring to FIG. 13, a flip chip package 200 of this example embodiment may include a semiconductor device 100, a substrate 210, an underfilling layer 220 and a conductive member 230.

Here, the semiconductor device 100 may include elements substantially the same as those of the semiconductor device in FIG. 1. Thus, the same reference numerals refer to the same elements and any further illustrations with respect to the same elements are omitted herein for brevity.

The substrate 210 may be arranged under the semiconductor device 100. Pads 212 may be arranged on an upper surface of the substrate 210. The pads 212 of the substrate 210 may correspond to the conductive bumps 150 of the semiconductor device 100. Here, the conductive bumps 150 may have a uniform size by providing a uniform current. Thus, good and reliable contacts between the conductive bumps 150 and the pads 212 may be ensured. As a result, electrical joint reliability between the substrate 210 and the semiconductor device 100 is significantly improved.

The underfilling layer 220 may be formed between the substrate 210 and the semiconductor device 100 to protect the conductive bumps 150 from external impacts.

The conductive members 230 may be mounted on a lower surface of the substrate 210. The conductive members 230 may be electrically connected to the pads 212 and the conductive bumps 150 via circuit patterns (not shown) in the substrate 210. That is, the conductive members 230 may be electrically connected to the semiconductor device 100 via the substrate 210. In this example embodiment, the conductive members 230 may include solder balls.

According to this example embodiment, the conductive bumps 150 having the uniform size may be mounted on the pads 212 of the substrate. Therefore, the electrical joint reliability between the substrate and the semiconductor device may be significantly improved.

Figure 14:
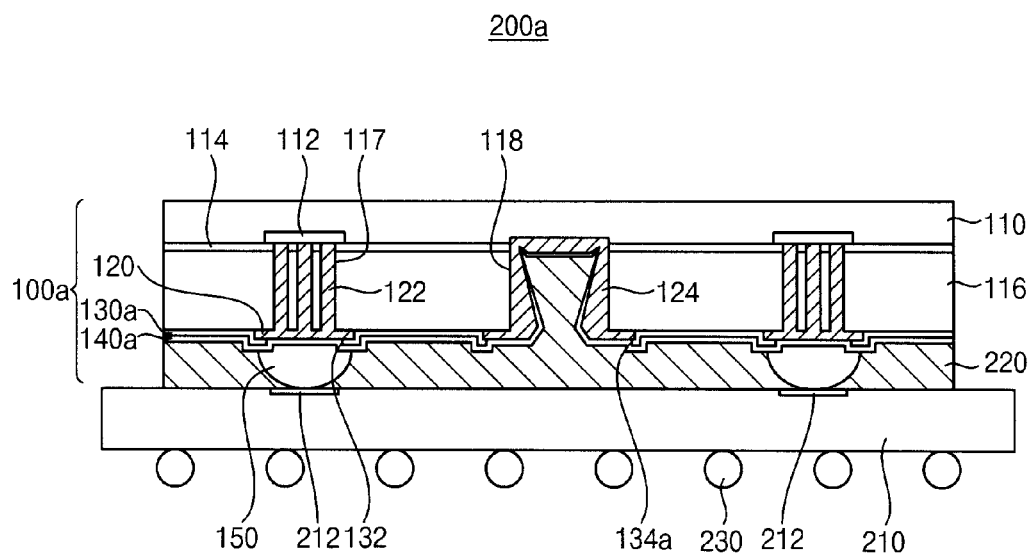
FIG. 14 is a cross-sectional view illustrating another embodiment of a flip chip package in accordance with some aspects of the present invention.

FIG. 14 is a cross-sectional view illustrating another embodiment of a flip chip package in accordance with aspects of the present invention.

Referring to FIG. 14, a flip chip package 200a of this example embodiment may include a semiconductor device 100a, a substrate 210, an underfilling layer 220 and conductive members 230.

Here, the semiconductor device 100a may include elements substantially the same as those of the semiconductor device in FIG. 2. Thus, the same reference numerals refer to the same elements and any further illustrations with respect to the same elements are omitted herein for brevity.

Further, the substrate 210, the underfilling layer 220, and the conductive members 230 of the flip chip package 200a may be substantially the same as those of the flip chip package 200 in FIG. 13, respectively. Thus, any further illustrations with respect to the substrate 210, the underfilling layer 220, and the conductive members 230 are omitted herein for brevity.

Method of Manufacturing a Flip Chip Package

Figure 15:
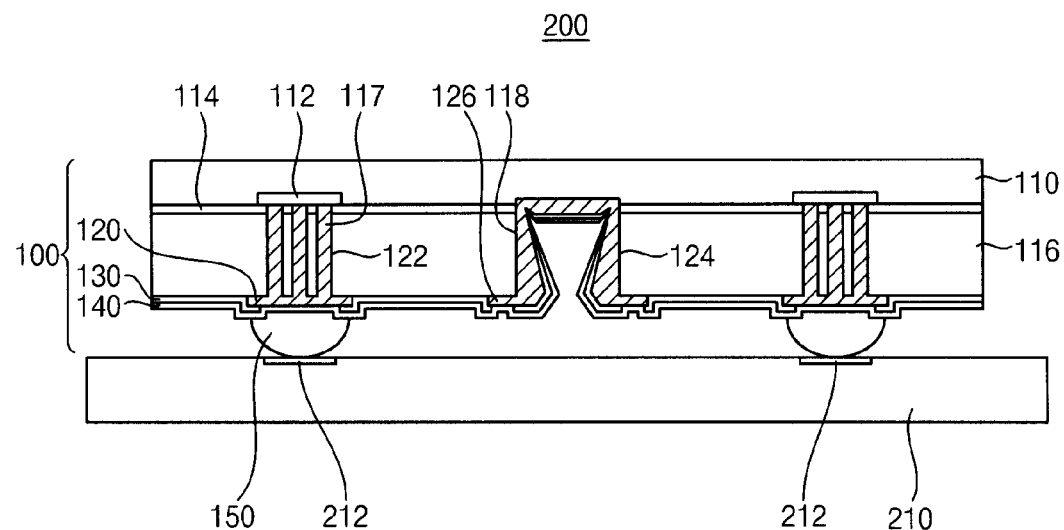
FIGS. 15 and 16 are cross-sectional views illustrating an embodiment of a method of manufacturing the flip chip package in FIG. 13.
Figure 16:
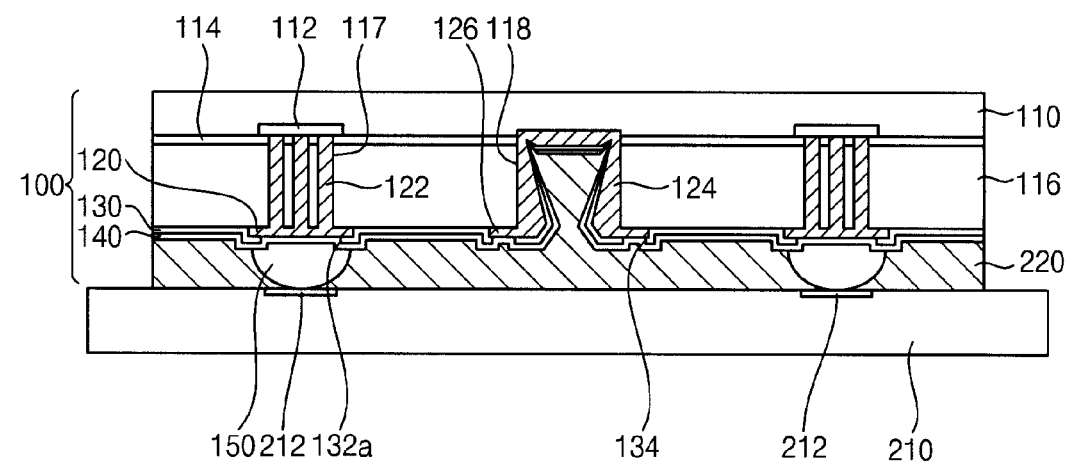

FIGS. 15 and 16 are cross-sectional views illustrating an embodiment of a method of manufacturing the flip chip package in FIG. 13.

Referring to FIG. 15, a semiconductor device 100 may be positioned over a substrate 210. Here, conductive bumps 150 of the semiconductor device 100 may be arranged to be oriented toward the substrate 210. The conductive bumps 150 may be mounted on pads 212 of the substrate 210.

Referring to FIG. 16, an underfilling layer 220 may be formed between the substrate 210 and the semiconductor device 100. Conductive members 230 may be mounted on a lower surface of the substrate 210 to complete the flip chip package 200 in FIG. 13.

Figure 17:
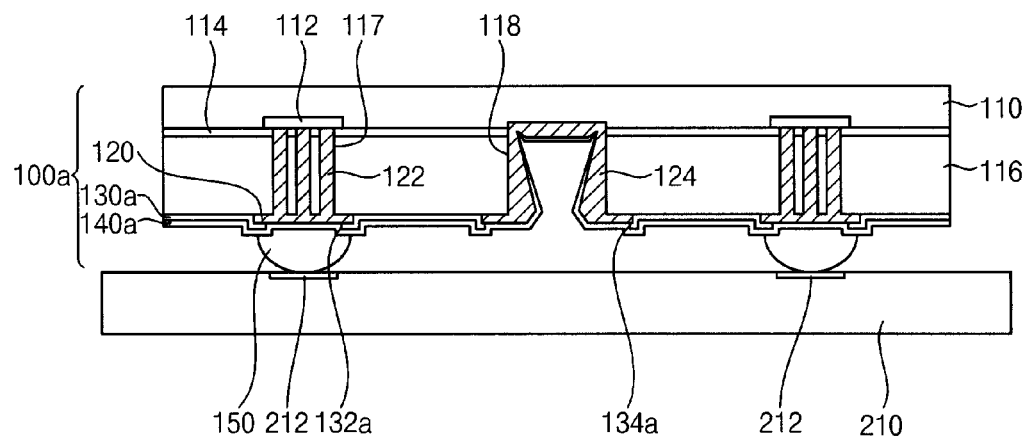
FIGS. 17 and 18 are cross-sectional views illustrating an embodiment of a method of manufacturing the flip chip package in FIG. 14.
Figure 18:
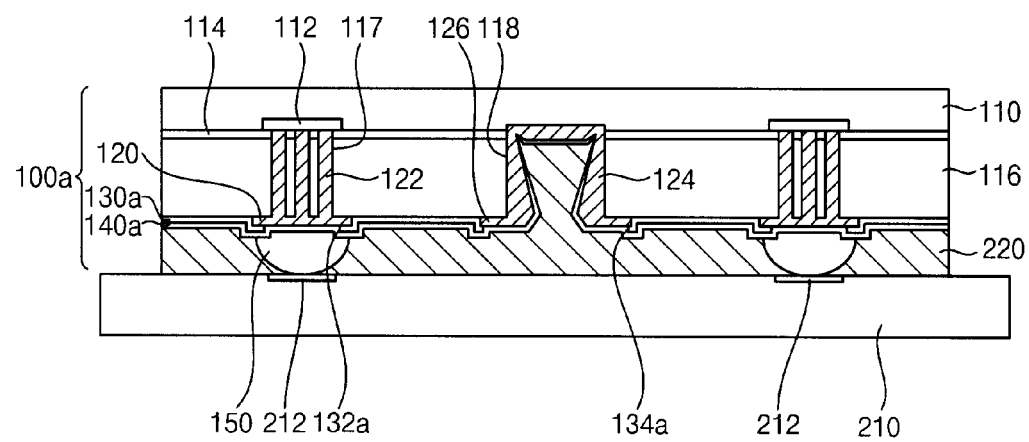

FIGS. 17 and 18 are cross-sectional views illustrating an embodiment of a method of manufacturing the flip chip package in FIG. 14.

Referring to FIG. 17, a semiconductor device 100 may be positioned over a substrate 210. Here, conductive bumps 150 of the semiconductor device 100 may be arranged oriented toward the substrate 210. The conductive bumps 150 may be mounted on pads 212 of the substrate 210.

Referring to FIG. 18, an underfilling layer 220 may be formed between the substrate 210 and the semiconductor device 100. Conductive members 230 may be mounted on a lower surface of the substrate 210 to complete the flip chip package 200a in FIG. 14.

According to some example embodiments of the present invention, the UBM layer 140 and the guard ring 124 make direct contact with each other. Thus, a current can flow through the guard ring 124 as well as the UBM layer 140 in the electroplating process for forming the conductive bumps 150. Therefore, a uniform current may be provided to the UBM layer 140 so that the conductive bumps 150 may have a uniform size. As a result, the flip chip package may have improved electrical joint reliability because the conductive bumps having the uniform size may be mounted on the substrate 210.

The foregoing is illustrative of the present invention and is not to be construed as limiting thereof. Although a few example embodiments in accordance with aspects of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of manufacturing a flip chip package, the method comprising:
    preparing a semiconductor chip that includes a pad and a guard ring, including forming an insulating layer pattern on the semiconductor chip and forming a trench that extends through the insulating layer pattern and into the semiconductor chip and forming the guard ring in the trench;
    forming a protective layer pattern on the semiconductor chip to expose the pad and the guard ring;
    forming an under bump metallurgy (UBM) layer on the protective layer pattern, the UBM layer in direct contact with the pad and the guard ring;
    forming conductive bumps on the UBM layer over the pad; and
    mounting the conductive bumps on a substrate.

2. The method of claim 1, further comprising forming an underfilling layer between the semiconductor chip and the substrate.

3. The method of claim 1, further comprising mounting conductive members on the substrate.

* * * * *